US010686068B2

(12) United States Patent
Morimoto

(10) Patent No.: US 10,686,068 B2
(45) Date of Patent: Jun. 16, 2020

(54) SEMICONDUCTOR DEVICE HAVING TERMINATION REGION WITH INSULATOR HAVING LOW COEFFICIENT OF MOISTURE ABSORPTION

(71) Applicant: Mitsubishi Electric Corporation, Tokyo (JP)

(72) Inventor: Noboru Morimoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/162,513

(22) Filed: Oct. 17, 2018

(65) Prior Publication Data

US 2019/0305140 A1 Oct. 3, 2019

(30) Foreign Application Priority Data

Mar. 27, 2018 (JP) ................................ 2018-060389

(51) Int. Cl.

*H01L 29/78* (2006.01)
*H01L 29/06* (2006.01)
*H01L 29/868* (2006.01)
*H01L 29/739* (2006.01)

(Continued)

(52) U.S. Cl.

CPC ...... *H01L 29/7823* (2013.01); *H01L 29/0619* (2013.01); *H01L 29/0623* (2013.01); *H01L 29/0638* (2013.01); *H01L 29/0696* (2013.01); *H01L 29/1095* (2013.01); *H01L 29/66121* (2013.01); *H01L 29/66348* (2013.01); *H01L 29/7397* (2013.01); *H01L 29/868* (2013.01)

(58) Field of Classification Search

CPC ............... H01L 29/868; H01L 29/0638; H01L 29/0696; H01L 29/0619; H01L 29/1095; H01L 29/7397; H01L 29/66348; H01L 29/66121; H01L 29/0623; H01L 29/7823

See application file for complete search history.

(56) References Cited

U.S. PATENT DOCUMENTS

2011/0291223 A1* 12/2011 Nakamura .......... H01L 23/3171 257/493
2013/0187240 A1* 7/2013 Takano ............ H01L 29/66333 257/409

(Continued)

FOREIGN PATENT DOCUMENTS

JP 4710224 B2 6/2011

*Primary Examiner* — Michael Jung
(74) *Attorney, Agent, or Firm* — Studebaker & Brackett PC

(57) ABSTRACT

A semiconductor device includes: a semiconductor substrate having a cell region in which a device is provided, and a termination region provided around the cell region; a first insulating film provided on the semiconductor substrate in the termination region and having a plurality of openings; a plurality of metal electrodes provided in the termination region and connected to the semiconductor substrate via the plurality of openings; and a second insulating film having lower coefficient of moisture absorption than that of the first insulating film and covering the first insulating film and the plurality of metal electrodes, wherein the second insulating film is in direct contact with the semiconductor substrate in a region from the outermost electrode of the plurality of metal electrodes to an end part of the semiconductor substrate.

8 Claims, 4 Drawing Sheets

(51) Int. Cl.
*H01L 29/66* (2006.01)
*H01L 29/10* (2006.01)

(56) References Cited

U.S. PATENT DOCUMENTS

| | | | | |
|---|---|---|---|---|
| 2016/0254375 | A1* | 9/2016 | Nakamura | H01L 29/404<br>257/144 |
| 2016/0260703 | A1* | 9/2016 | Nakamura | H01L 29/404 |
| 2017/0352730 | A1* | 12/2017 | Nakamura | H01L 29/739 |

* cited by examiner

SEMICONDUCTOR DEVICE HAVING TERMINATION REGION WITH INSULATOR HAVING LOW COEFFICIENT OF MOISTURE ABSORPTION

BACKGROUND OF THE INVENTION

Field

The present invention relates to a semiconductor device wherein a protective film is provided on a device surface.

Background

For the purpose of protection of a semiconductor device, a protective film composed of an inorganic material or an organic material is provided on the device surface. As the inorganic protective film, a silicon oxide film or a silicon nitride film is used. In particular, since a silicon nitride film has low permeability against moisture, it is used as a protective film on the uppermost surface for preventing moisture from infiltrating from the outside.

When a THB (Temperature Humidity Bias) test in which a high-temperature and high-humidity environment is simulated is performed on a semiconductor package, device failure occasionally arises due to infiltration of moisture. When moisture infiltrates into the package, the moisture occasionally diffuses in a sealing material to reach the semiconductor device. There has been a case where the moisture infiltrates from the device end part into the device interior, which can result in corrosion of an aluminum electrode, and therefore, device failure. When corrosion of the aluminum electrode of a guard ring arises, a withstand voltage cannot be held, which leads to leakage failure and withstand voltage failure. Against this, there is proposed a semiconductor device in which a silicon oxide film and a silicon nitride film are stacked as protective films on the surface of a semiconductor substrate (for example, see JP 4710224 B).

SUMMARY

In the conventional art, moisture can be prevented from infiltrating from the device surface into the device interior in the vertical direction. However, infiltration of moisture in the horizontal direction has not been able to be prevented, which arises from the device end part toward the device interior through the silicon oxide film or through the interface between the silicon oxide film and the silicon nitride film.

The present invention is devised in order to solve the aforementioned problem, and an object thereof is to obtain a semiconductor device capable of preventing moisture from infiltrating from the device end part to the device interior.

A semiconductor device according to the present invention includes: a semiconductor substrate having a cell region in which a device is provided, and a termination region provided around the cell region; a first insulating film provided on the semiconductor substrate in the termination region and having a plurality of openings; a plurality of metal electrodes provided in the termination region and connected to the semiconductor substrate via the plurality of openings; and a second insulating film having lower coefficient of moisture absorption than that of the first insulating film and covering the first insulating film and the plurality of metal electrodes, wherein the second insulating film is in direct contact with the semiconductor substrate in a region from the outermost electrode of the plurality of metal electrodes to an end part of the semiconductor substrate.

In the present invention, the second insulating film having low coefficient of moisture absorption is in direct contact with the semiconductor substrate in a region from the outermost electrode to an end part of the semiconductor substrate. Therefore, moisture can be prevented from infiltrating from the device end part into the device interior.

Other and further objects, features and advantages of the invention will appear more fully from the following description.

DESCRIPTION OF EMBODIMENTS

A semiconductor device according to the embodiments of the present invention will be described with reference to the drawings. The same components will be denoted by the same symbols, and the repeated description thereof may be omitted.

First Embodiment

Figure 1:
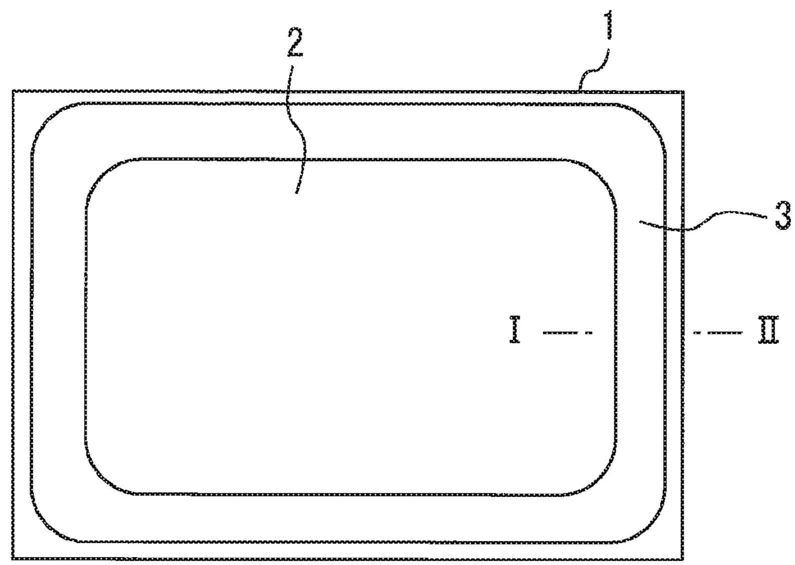
FIG. 1 is a top view illustrating a semiconductor device according to a first embodiment.

FIG. 1 is a top view illustrating a semiconductor device according to a first embodiment. The semiconductor substrate 1 has a cell region 2 in which a device is provided, and a termination region 3 provided around the cell region 2. While the device is a pin diode, not limited to this, it may be an IGBT (Insulated Gate Bipolar Transistor). In the cell region 2, a principal current flows in an ON state of the device. A current does not flow in the termination region 3 in the ON state, but in reverse bias application in an OFF state, a depletion layer expands in the device transverse direction to hold a withstand voltage.

Figure 2:
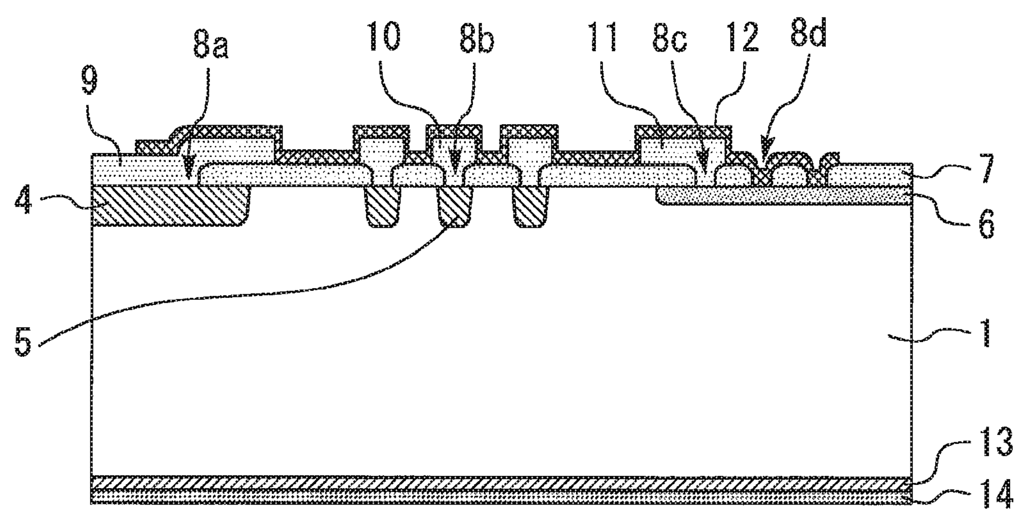
FIG. 2 is a cross-sectional view taken along I-II in FIG. 1.

FIG. 2 is a cross-sectional view taken along I-II in FIG. 1. In the cell region 2, a p-type anode layer 4 is provided in a surface portion of the $n^-$-type semiconductor substrate 1. In the termination region 3, a plurality of p-type guard ring layers 5 are provided in a surface portion of the semiconductor substrate 1, and an n-type channel stopper layer 6 is provided outward of the p-type guard ring layers 5 in a surface portion of the semiconductor substrate 1.

An insulating film 7 is provided on the semiconductor substrate 1. The insulating film 7 is, for example, a silicon oxide film, and is formed by thermal oxidation, CVD or coating. Moreover, the insulating film 7 may be a silicon oxide film to which B, P or the like is added, such as BPSG or PSG.

In the insulating film 7, a plurality of openings 8*a*, 8*b*, 8*c* and 8*d* are provided by lithography and etching. The opening 8*a* is provided on the p-type anode layer 4, the opening 8*b* is provided on the p-type guard ring layer 5, and the openings 8*c* and 8*d* are provided on the n-type channel stopper layer 6. The opening 8*d* is positioned outward of the opening 8*c* to enclose the opening 8*c* into a ring shape.

An anode electrode 9 is connected to the p-type anode layer 4 via the opening 8*a*. A guard ring electrode 10 is connected to the p-type guard ring layer 5 via the opening 8*b*. A channel stopper electrode 11 is connected to the n-type channel stopper layer 6 via the opening 8*c*. This channel stopper electrode 11 is the outermost electrode of a plurality of electrodes formed on the surface of the substrate.

The anode electrode 9, the guard ring electrode 10 and the channel stopper electrode 11 are made of aluminum. For example, processing into these electrodes is performed by lithography and etching of an aluminum film, after forming the aluminum film by a sputtering method or the like. Notably, the electrode structure may be based on a simple substance of aluminum or may be formed by stacking a barrier metal material on aluminum.

A depletion layer expanding in the right-left direction inside an $n^-$-type drift layer below the p-type guard ring layers 5 is provided in the OFF state of the device. Moreover, since the potential of the termination region 3 can be stabilized by the guard ring electrode 10 connected to the p-type guard ring layer 5, the withstand voltage of the semiconductor device can be suppressed from deteriorating.

An insulating film 12 lower in coefficient of moisture absorption than the insulating film 7 covers the insulating film 7, the anode electrode 9, the guard ring electrode 10 and the channel stopper electrode 11. The insulating film 12 is the passivation film on the uppermost surface and is composed, for example, of a silicon nitride film. In a region from the outermost channel stopper electrode 11 to the end part of the semiconductor substrate 1, the insulating film 12 is in direct contact with the semiconductor substrate 1 via the opening 8*d*.

In order to electrically connect the anode electrode 9 to the outside, similarly to the insulating film 7, an opening is provided in the insulating film 12 above the anode electrode 9 by lithography and etching. Notably, on the uppermost surface, an organic protective film such as polyimide (PI) or polybenzoxazole (PBO) may be provided. In this case, an opening is provided therein above the anode electrode 9 similarly to the insulating film 12. With the organic protective film, filler in sealing resin can be prevented from damaging the chip.

When a wafer is separated into chips by dicing, it is needed to prevent transfer of a crack into the device interior and clogging of a dicer in dicing. Therefore, a silicon nitride film, a metal film and polyimide are not formed in the outermost portion of the semiconductor substrate 1 which is a dicing region. Note that only the insulating film 7 which is a silicon oxide film is formed such that the surface of the semiconductor substrate 1 is not beaten in dry etching. An n-type cathode layer 13 is provided on the whole rear surface of the semiconductor substrate 1. A cathode electrode 14 is connected to the n-type cathode layer 13.

Figure 3:
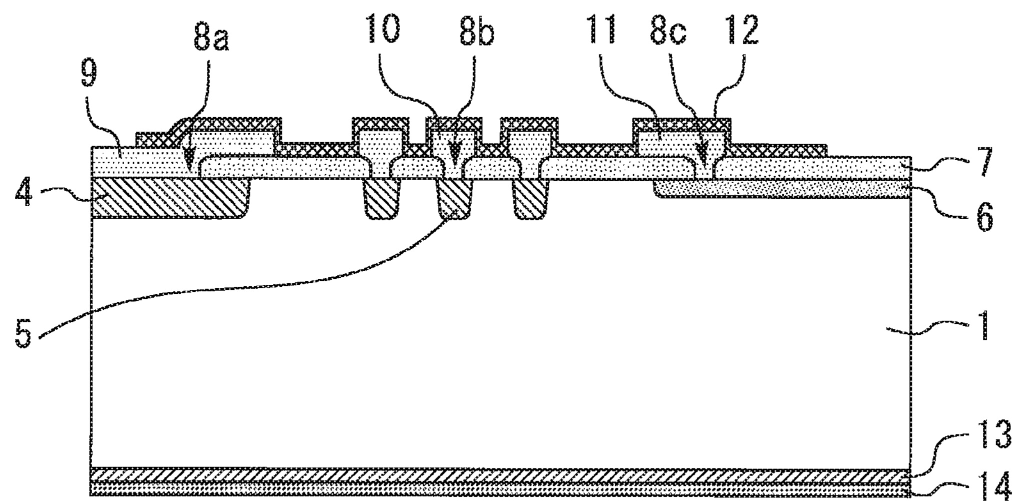
FIG. 3 is a cross-sectional view illustrating a semiconductor device according to the comparative example.

Subsequently, effects of the present embodiment are described with comparison with those of a comparative example. FIG. 3 is a cross-sectional view illustrating a semiconductor device according to the comparative example. In the comparative example, the insulating film 12 is not in contact with the semiconductor substrate 1. Therefore, moisture infiltrates into the device interior from the device end part through the insulating film 7 or through the interface between the insulating film 7 and the insulating film 12. As a result, corrosion of an aluminum electrode in the device interior tends to arise, which leads to malfunction.

On the contrary, in the present embodiment, in the region from the outermost channel stopper electrode 11 to the end part of the semiconductor substrate 1, the insulating film 12 low in coefficient of moisture absorption is in direct contact with the semiconductor substrate 1. The insulating film 7 is divided into pieces, between these, the insulating film 12 low in coefficient of moisture absorption is positioned, and thereby, moisture can be prevented from infiltrating from the device end part into the device interior. As a result, a highly reliable semiconductor device can be provided. Moreover, only by changing the number of openings in the insulating film 7 in the termination region 3, moisture absorption resistance can be improved, hence, additional processes do not arise, and production costs do not increase.

Figure 4:
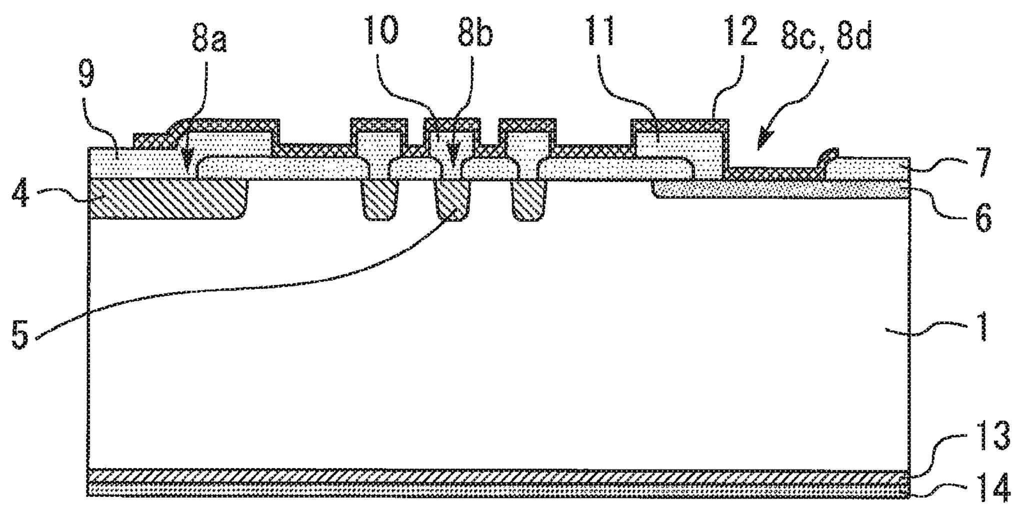
FIG. 4 is a cross-sectional view illustrating a first modification of the semiconductor device according to the first embodiment.

FIG. 4 is a cross-sectional view illustrating a first modification of the semiconductor device according to the first embodiment. In the region from the outermost channel stopper electrode 11 to the end part of the semiconductor substrate 1, the openings 8*c* and 8*d* are integrated into one to be wide in the insulating film 7, and the openings 8*c* and 8*d* are covered by the insulating film 12 low in moisture absorption. Thereby, moisture absorption resistance can be further improved. Note that the insulating film 7 is left in the end part, of the semiconductor substrate 1, which corresponds to a dicing line.

Figure 5:
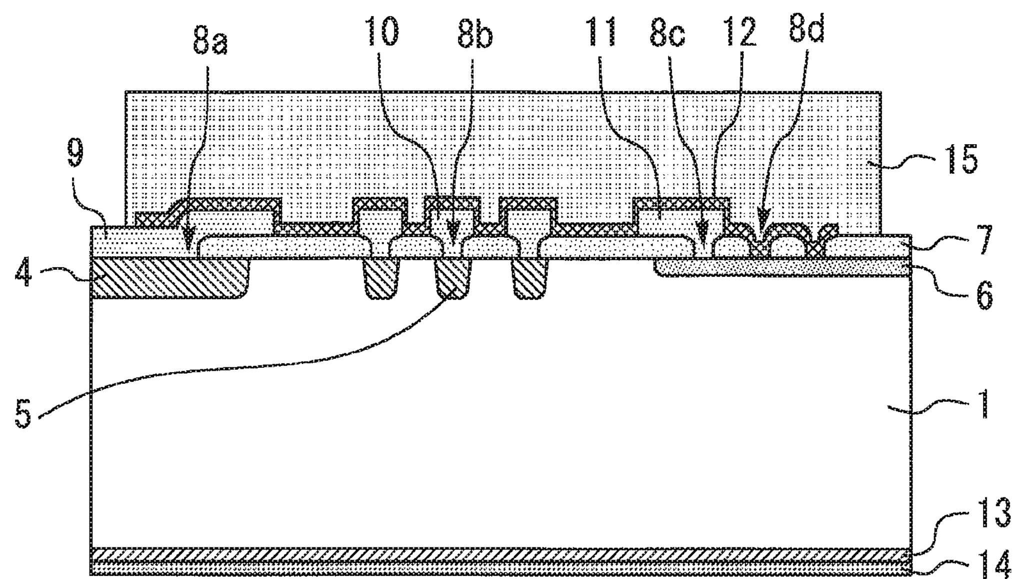
FIG. 5 is a cross-sectional view illustrating a second modification of the semiconductor device according to the first embodiment.

FIG. 5 is a cross-sectional view illustrating a second modification of the semiconductor device according to the first embodiment. A third insulating film 15 composed of an organic insulating film such as polyimide is formed on the insulating film 12. Similarly also in this case, moisture blocking performance in the opening 8*d* can be improved.

Second Embodiment

Figure 6:
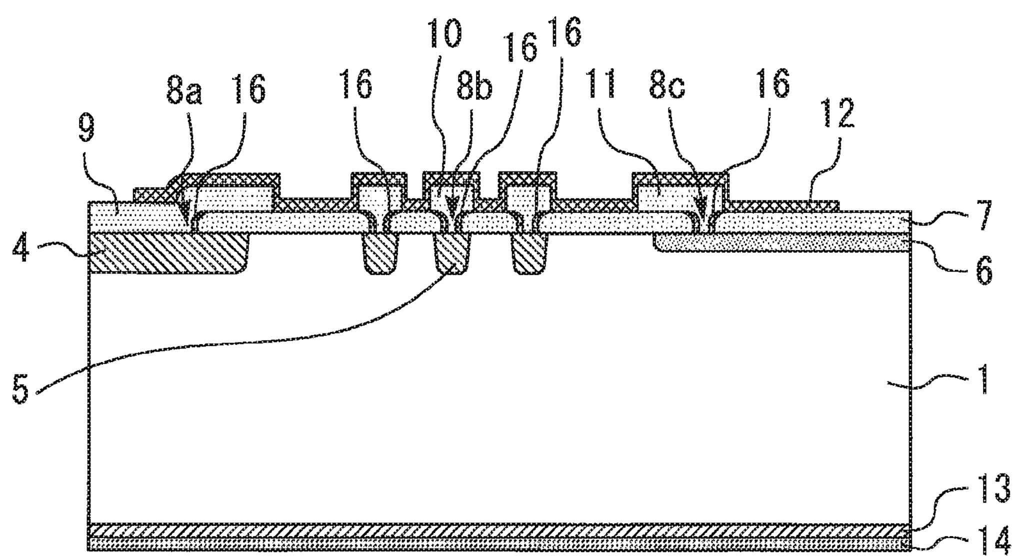
FIG. 6 is a cross-sectional view illustrating a semiconductor device according to a second embodiment.

FIG. 6 is a cross-sectional view illustrating a semiconductor device according to a second embodiment. While in the first embodiment, the insulating film 12 is in contact with the semiconductor substrate 1, in the present embodiment, an insulating film 16 is provided on sidewalls of the openings 8*a*, 8*b* and 8*c*. The insulating film 16 is, for example, a silicon nitride film, and is lower in coefficient of moisture absorption than the insulating film 7.

In its manufacturing method, first, the insulating film 16 is formed on the whole surface by CVD after the openings 8*a*, 8*b* and 8*e* are formed in the insulating film 7. Next, the insulating film 16 that is formed on the insulating film 7 and on the bottom faces of the openings 8*a*, 8*b* and 8*c* is removed by an etching-back method. Thereby, the insulating film 16 can be left only on the sidewalls of the openings 8*a*, 8*b* and 8*c*.

Notably, the insulating film 16 is provided on the sidewalls of all the openings in the insulating film 7. Not limited to this, note that even when the insulating film 16 is provided only on the sidewall of the outermost opening 8*c*, moisture can be prevented from infiltrating from the device end part into the device interior. In this case, after the insulating film 16 is formed in all the openings, only the outermost opening 8*c* may be masked, followed by isotropic etching. Moreover, when the sizes of the openings are large, even when the insulating film 16 is provided on the sidewalls of the openings, conduction failure does not arise between the semiconductor substrate 1 and metal electrodes.

Figure 7:
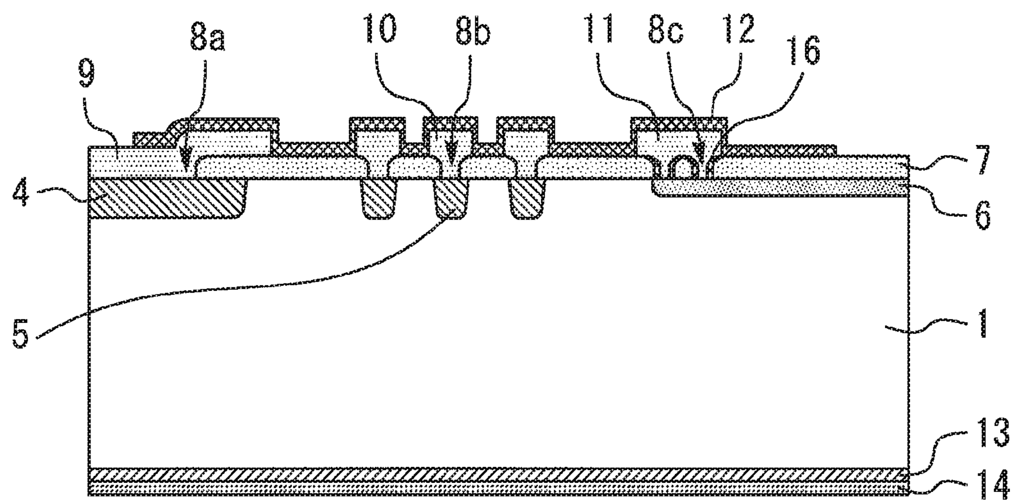
FIG. 7 is a cross-sectional view illustrating a modification of the semiconductor device according to the second embodiment.

FIG. 7 is a cross-sectional view illustrating a modification of the semiconductor device according to the second embodiment. A plurality of openings 8*c* for connecting the channel stopper electrode 11 and the semiconductor substrate 1 together are provided. By providing the insulating film 16 low in coefficient of moisture absorption on the sidewalls of these plurality of openings 8*c*, moisture can be further suppressed from infiltrating into the device interior.

Third Embodiment

Figure 8:
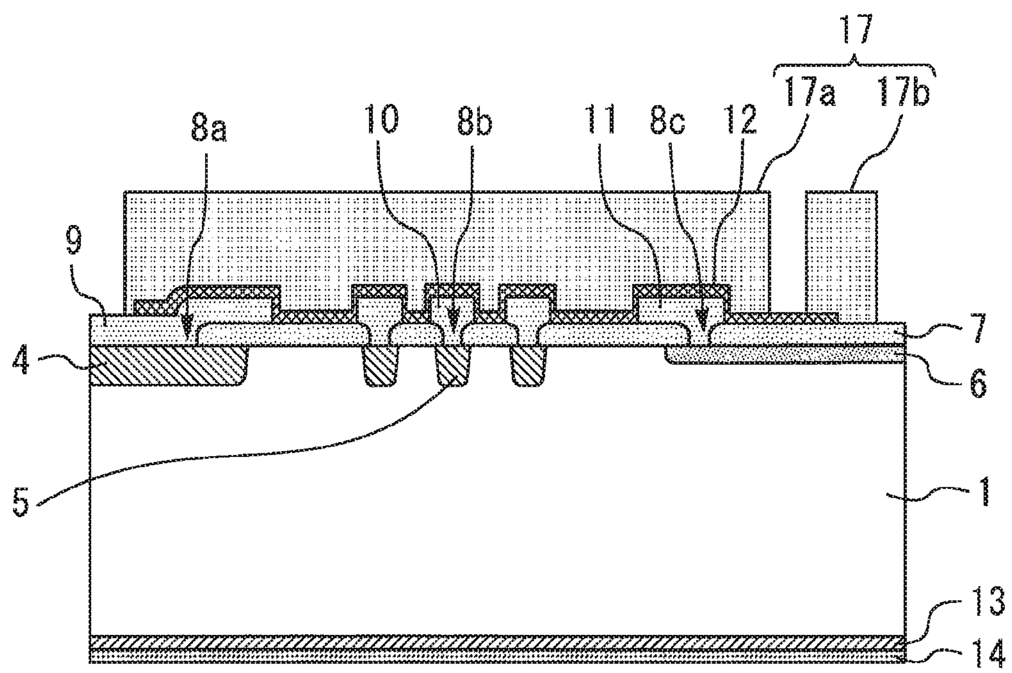
FIG. 8 is a cross-sectional view illustrating a semiconductor device according to a third embodiment.

FIG. 8 is a cross-sectional view illustrating a semiconductor device according to a third embodiment. While in the first embodiment, the insulating film 12 is in contact with the semiconductor substrate 1, in the present embodiment, an insulating film 17 is provided on the insulating films 7 and 12. In order to electrically connect the anode electrode 9 to the outside, similarly to the insulating film 12, an opening is provided in the insulating film 17 above the anode electrode 9.

The insulating film 17 is composed of an organic material such as polyimide generally used for the purpose of chip protection, and is higher in coefficient of moisture absorption than the insulating film 7. Therefore, moisture in the insulating film 7 is absorbed by the insulating film 17. Moreover, the insulating film 17 has a first portion 17*a* and a second portion 17*b* which are separated from each other. The first portion 17*a* is provided on the insulating film 12. The second portion 17*b* is provided in the region from the outermost channel stopper electrode 11 to the end part of the semiconductor substrate 1, and is in direct contact with the insulating film 7 not via the insulating film 12. Accordingly, moisture can be suppressed from transferring into the device interior through the inside of the insulating film 7 or through the interface between the insulating films 7 and 12. Moreover, by dividing the insulating film 17, moisture can be suppressed from transferring into the device interior through the insulating film 17.

The semiconductor substrate 1 is not limited to a substrate formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor device formed of such a wide-bandgap semiconductor has a high voltage resistance and a high allowable current density, and thus can be miniaturized. The use of such a miniaturized semiconductor device enables the miniaturization and high integration of the semiconductor module in which the semiconductor device is incorporated. Further, since the semiconductor device has a high heat resistance, a radiation fin of a heatsink can be miniaturized and a water-cooled part can be air-cooled, which leads to further miniaturization of the semiconductor module. Further, since the semiconductor device has a low power loss and a high efficiency, a highly efficient semiconductor module can be achieved.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2018-060389, filed on Mar. 27, 2018 including specification, claims, drawings and summary, on which the Convention priority of the present application is based, is incorporated herein by reference in its entirety.

The invention claimed is:

1. A semiconductor device comprising:

a semiconductor substrate having a cell region in which a device is provided, and a termination region provided around the cell region;

a first insulating film provided on the semiconductor substrate in the termination region and having a plurality of openings;

a plurality of metal electrodes provided in the termination region and connected to the semiconductor substrate via the plurality of openings; and a second insulating film having lower coefficient of moisture absorption than that of the first insulating film and covering the first insulating film and the plurality of metal electrodes, wherein the second insulating film is in direct contact with the semiconductor substrate within at least one of the plurality of openings, the direct contact being across an entire width of the at least one opening and in a region from the outermost electrode of the plurality of metal electrodes to an end part of the semiconductor substrate.

2. The semiconductor device according to claim 1, wherein a plurality of p-type guard ring layers are provided in a surface portion of the semiconductor substrate in the termination region, an n-type channel stopper layer is provided outward of the p-type guard ring layers in a surface portion of the semiconductor substrate, and the plurality of metal electrodes include a guard ring electrode connected to the p-type guard ring layer, and a channel stopper electrode that is the outermost electrode and connected to the n-type channel stopper layer.

3. The semiconductor device according to claim 2, wherein the semiconductor substrate is formed of a wide-bandgap semiconductor.

4. The semiconductor device according to claim 1, wherein the semiconductor substrate is formed of a wide-bandgap semiconductor.

5. A semiconductor device comprising:

a semiconductor substrate having a cell region in which a device is provided, and a termination region provided around the cell region;

a first insulating film provided on the semiconductor substrate in the termination region and having a plurality of openings;

a plurality of metal electrodes provided in the termination region and connected to the semiconductor substrate via the plurality of openings; and a second insulating film provided over the first insulating film and having lower coefficient of moisture absorption than that of the first insulating film and provided on and in direct contact with a sidewall of the opening corresponding to at least the outermost electrode of the plurality of electrodes.

6. The semiconductor device according to claim 5, wherein a plurality of p-type guard ring layers are provided in a surface portion of the semiconductor substrate in the termination region, an n-type channel stopper layer is provided outward of the p-type guard ring layers in a surface portion of the semiconductor substrate, and the plurality of metal electrodes include a guard ring electrode connected to the p-type guard ring layer, and a channel stopper electrode that is the outermost electrode and connected to the n-type channel stopper layer.

7. The semiconductor device according to claim 5, wherein the semiconductor substrate is formed of a wide-bandgap semiconductor.

8. The semiconductor device according to claim 6, wherein the semiconductor substrate is formed of a wide-bandgap semiconductor.

* * * * *